United States Patent
Li

(10) Patent No.: US 10,809,298 B2
(45) Date of Patent: Oct. 20, 2020

(54) BATCH TESTING SYSTEM AND METHOD THEREOF

(71) Applicants: Inventec (Pudong) Technology Corporation, Shanghai (CN); Inventec Corporation, Taipei (TW)

(72) Inventor: Yan Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 131 days.

(21) Appl. No.: 16/228,492

(22) Filed: Dec. 20, 2018

(65) Prior Publication Data

US 2020/0191865 A1 Jun. 18, 2020

(30) Foreign Application Priority Data

Dec. 13, 2018 (CN) .......................... 2018 1 1523855

(51) Int. Cl.
| | |
|---|---|
| *G06F 11/00* | (2006.01) |
| *G01R 31/317* | (2006.01) |
| *G06F 11/07* | (2006.01) |
| *G06F 11/26* | (2006.01) |
| *G06F 11/22* | (2006.01) |

(52) U.S. Cl.
CPC ... *G01R 31/3172* (2013.01); *G01R 31/31718* (2013.01); *G06F 11/0784* (2013.01); *G06F 11/2273* (2013.01); *G06F 11/26* (2013.01)

(58) Field of Classification Search
CPC ... G06F 11/0784; G06F 11/2273; G06F 11/26
See application file for complete search history.

(56) References Cited

U.S. PATENT DOCUMENTS

| 10,585,835 B1* | 3/2020 | Durai .................. G11C 7/1057 |
| 2018/0276010 A1* | 9/2018 | H ....................... G06F 9/44557 |
| 2020/0025824 A1* | 1/2020 | Zhao .................. G01R 31/3191 |

* cited by examiner

*Primary Examiner* — Charles Ehne
(74) *Attorney, Agent, or Firm* — David R. Stevens; Stevens Law Group

(57) ABSTRACT

A batch testing system includes a test device, a plurality of machines to be tested and a server. The test device writes a BIOS with a RMT test to each machine to be tested, and starts each machine to be tested to run the RMT test, and then each machine to be tested writes a test result to a specific storage location in a baseboard management controller thereof. When entering an operating system, each machine to be tested reads and analyzes the test result at the specific storage location to output an analysis result, and then transmits the analysis result to the server through a network. The server receives and counts the analysis results transmitted by the machines to be tested. Therefore, the batch testing system can deploy the RMT test, and no intervention from operators is required in the whole process, which is suitable for the production testing stage.

8 Claims, 2 Drawing Sheets

BATCH TESTING SYSTEM AND METHOD THEREOF

CROSS-REFERENCE TO RELATED APPLICATION

This application claims the benefit of Chinese Patent Application No. 201811523855.7, filed Dec. 13, 2018.

BACKGROUND OF THE INVENTION

1. Field of the Invention

The present invention relates to a testing system and a method thereof. In particular, the invention pertains to a batch testing system and a method thereof.

2. Description of the Related Art

The rank margining tool (RMT) test is a test for verifying the compatibility of the memory and the motherboard, and is implemented and completed in the power-on self-test (POST) phase of the basic input/output system (BIOS).

The testing flow of the current RMT test is only applied to the design verification phase, which includes the following steps: writing a BIOS with a RMT test in each machine to be tested; starting each machine to be tested for running the RMT test; after the RMT test being completed, each machine to be tested outputting a test result to a upper computer with an analysis tool via a serial port thereof; and an operator manually enabling the analysis tool of the upper computer, so that the upper computer analyzing each test result to obtain whether each machine to be tested passes or fails the RMT test.

However, when the above method is applied to the production testing stage, the following problems arise. Since each machine to be tested needs to output a test result through its serial port, each machine to be tested needs to have a serial port, thereby soaring costs. In addition, since all the test results transmitted by the machine to be tested need to be analyzed and processed by the upper computer with the analysis tool, there is a problem of low test efficiency. Moreover, since all the test results need to be checked in a serial manner, there is a problem that the test results of the machines to be tested on the production line may not be analyzed when the upper computer fails, and there is a huge impact on the production capacity. Furthermore, the operator is required in the process, so that there is a problem that large-scale operations are not achieved.

In summary, it can be seen that there are problems in the prior art that when the current RMT test process is applied to the production testing stage, it has the difficulty in deployment, the difficulty in collecting test results, the inefficiency in testing, and the inability to scale up operations. Therefore, it is necessary to propose an improved technical solution to solve these problems.

SUMMARY OF THE INVENTION

In order to solve aforementioned problem, the present invention discloses a batch testing system and a method thereof.

First, the present invention discloses the batch testing system, which is suitable for a production testing stage. The batch testing system includes a test device, a plurality of machines to be tested and a server. The test device includes an input module and a startup module, and the startup module is connected to the input module. Each of the plurality of machines to be tested includes a reading module, an analysis module, and a transmission module, the analysis module is connected to the reading module, and the transmission module is connected to the analysis module. The input module is configured to write a BIOS having a RMT test into each of the plurality of machines to be tested. The startup module is configured to start each of the plurality of machines to be tested to make each of the plurality of machines to be tested perform the RMT test and write a test result to a specific storage location in a BMC thereof. In each of the plurality of machines to be tested, the reading module is configured to read the test result located at the specific storage location after entering an operating system; the analysis module is configured to analyze the test result and output an analysis result; and the transmission module is configured to transmit the analysis result through a network. The server is configured to receive and count the analysis results transmitted by the plurality of machines to be tested.

In addition, the present invention discloses the batch testing method suitable for a production testing stage. The batch testing method includes following steps: providing a batch testing system comprising a test device, a plurality of machines to be tested and a server, the test device comprising an input module and a startup module, the startup module being connected to the input module, each of the plurality of machines to be tested comprising a reading module, an analysis module and a transmission module, the analysis module being connected to the reading module, and the transmission module being connected to the analysis module; writing, by the input module, a BIOS having a RMT test into each of the plurality of machines to be tested; starting, by the startup module, each of the plurality of machines to be tested to make each of the machines to be tested perform the RMT test and write a test result to a specific storage location in a BMC thereof; reading, by the reading module of each of the plurality of machines to be tested, the test result located at the specific storage location after each of the plurality of machines to be tested entering an operating system; analyzing, by the analysis module of each of the plurality of machines to be tested, the test result and outputting an analysis result; transmitting, by the transmission module of each of the plurality of machines to be tested, the analysis result through a network; and receiving and counting, by the server, the analysis results transmitted by the plurality of machines to be tested.

The system and method disclosed by the present invention are as above, and the difference from the prior art is that the test device writing the BIOS with the RMT test to each machine to be tested, and starting each machine to be tested to run the RMT test, and then each machine to be tested writing the test result to the specific storage location in the BMC thereof; next, when entering the operating system, each machine to be tested reading and analyzing the test result at the specific storage location to output the analysis result, and then transmitting the analysis result to the server through the network; and after that, the server receiving and counting the analysis results transmitted by the machines to be tested.

By aforementioned technology means, the present invention can deploy the RMT test in the production testing stage, the automatic test processing is achieved, and no intervention from operators is required in the whole process, thereby suitable for the production testing stage.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
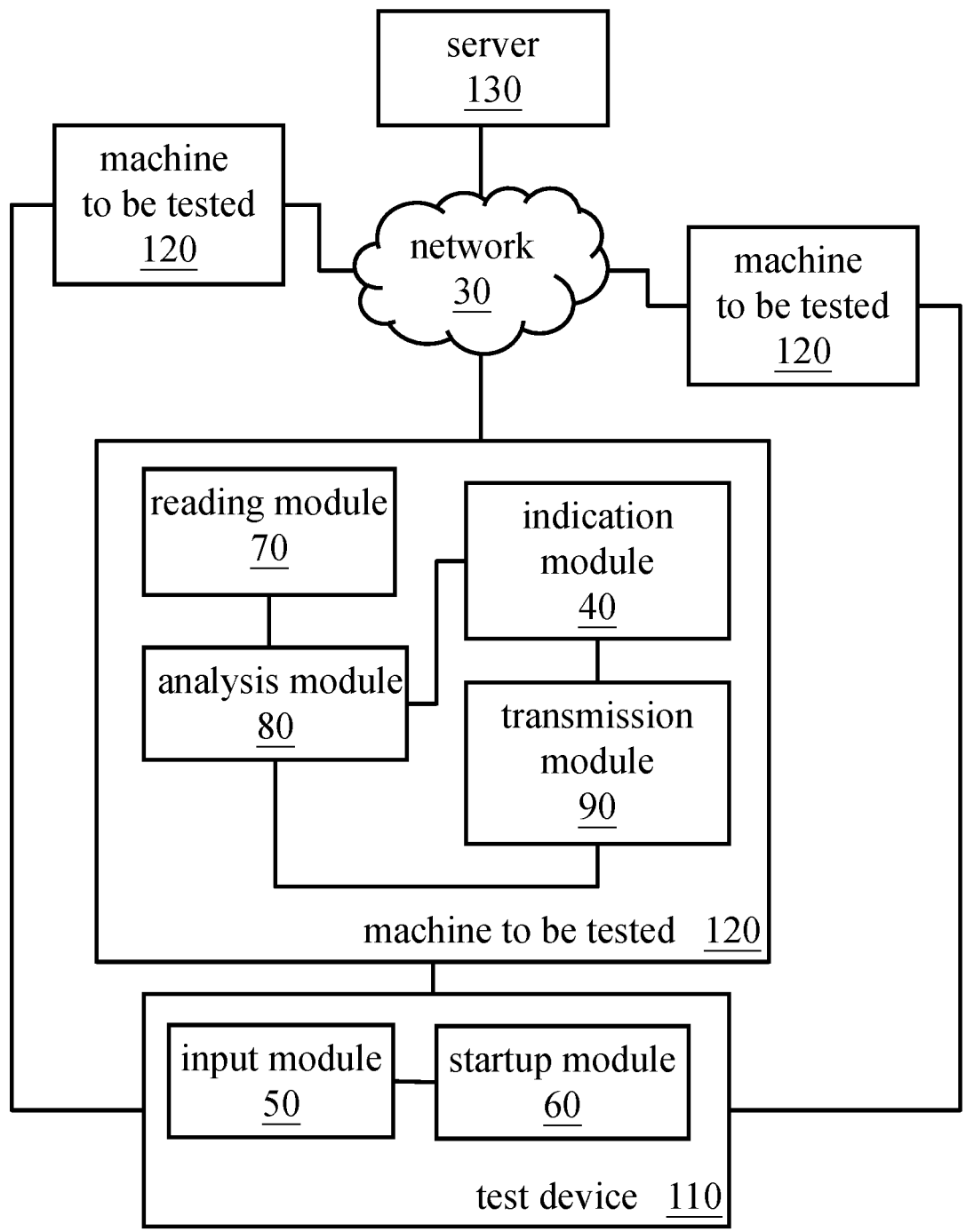
FIG. 1 is a system block diagram of an embodiment of a batch testing system of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

As used herein, the term "or" includes any and all combinations of one or more of the associated listed items. It will be understood that when an element is referred to as being "connected to" another element, it can be connected to the other element, or intervening elements may be present. In contrast, when an element is referred to as being "directly connected to" another element, there are no intervening elements present.

In addition, unless explicitly described to the contrary, the word "comprise" and variations such as "comprises" or "comprising", will be understood to imply the inclusion of stated elements but not the exclusion of any other elements.

Please refer to FIG. 1, and FIG. 1 is a system block diagram of an embodiment of a batch testing system of the present invention. In this embodiment, the batch testing system 100 is suitable for the production testing stage, and may comprise a testing device 110, a plurality of machines to be tested 120 and a server 130, wherein the testing device 110 may comprise an input module 50 and a startup module 60, the startup module 60 is connected to the input module 50, and each of the machines 120 to be tested may comprise a reading module 70, an analysis module 80, and a transmission module 90, the analysis module 80 is connected to the reading module 70, and the transmission module 90 is connected to the analysis module 80. In this embodiment, the number of the machines to be tested 120 may be, but not limited to, fifty, but the embodiment is not intended to limit the present invention, and the number of the machines to be tested 120 may be adjusted according to actual needs. It should be noted that in order to avoid the complexity of the drawing, only three machines to be tested 120 are drawn.

The test device 110, each of the machines to be tested 120, and the server 130 included in the batch testing system 100 can be implemented in various manners, including software, hardware, firmware, or any combination thereof. The techniques used in the implementation of the software or firmware can be stored in a machine readable storage medium, such as read-only memory (ROM), random access memory (RAM), disk storage media, optical storage media, flash memory device and the like, and may be executed by one or more general purpose or special purpose programmable microprocessors. The machine to be tested 120 and the server 130 included in the batch testing system 100 can communicate with each other through a network such as an internet, a local area network, a wide area network, and/or a wireless network. The transmission of signals and data between the machine to be tested 120 and the server 130 may be performed through copper transmission cables, fiber optic transmissions, wireless transmissions, routers, firewalls, switches, gateway computers, and/or edge servers.

The input module 50 can be configured to write a BIOS having a RMT test into each machine to be tested 120; and the startup module 60 can be configured to start each of the machines to be tested 120 to make each of the machines to be tested 120 perform the RMT test and write a test result to a specific storage location in a BMC thereof. In other words, the startup module 60 can start each of the machines to be tested 120 after the input module 50 writes the BOS having the RMT test into each of the machines to be tested 120, so that each machine to be tested 120 runs the RMT test in the BIOS and then stores the test result in the specific storage location of the BMC thereof. In this embodiment, since the test result generated after each machine to be tested 120 runs the RMT test, is no longer transmitted through the serial port of each machine to be tested 120, the test result is written into the BMC of each machine to be tested 120. Thus, it can avoid the waste of cost caused by the need of the serial ports, and can avoid the impact of data failure during the transmission process, thereby affecting the test results.

In each machine to be tested 120, the reading module 70 can be configured to read the test result located at the specific storage location after entering an operating system (OS); the analysis module 80 can be configured to analyze the test result and output an analysis result; and the transmission module 90 can be configured to transmit the analysis result through a network 30. In other words, when each machine to be tested 120 enters the OS after executing the BIOS, the test result at the specific storage location of the BMC can be read through the reading module 70, and then the test result can be analyzed by the analysis module 80. As a result, the analysis result is obtained. Finally, the analysis result is transmitted to the server 130 through the network 30 by the transmission module 90. Since each machine to be tested 120 writes its test result into its own BMC, the analysis module 80 can be deployed in each of the machines to be tested 120, so that each machine to be tested 120 can analyze its own test result. The analysis result may be only indicated that passing or failing the RMT test. In other words, the analysis module 80 actually performs analysis and parallel processing of the test result, and finally only output the analysis result of passing or failing the RMT test.

In this embodiment, the server 130 can be configured to receive and count the analysis results transmitted by the machines to be tested 120. Since the analysis result transmitted by each machine to be tested 120 may be indicated that passing or failing the RMT test, the server 130 may count how many machines to be tested 120 pass the RMT test, and how many machines to be tested 120 fail the RMT test.

In addition, in this embodiment, when the number of the analysis results received by the server 130 reaches a predetermined value, the pass rate may be displayed by the server 130. The predetermined value may be, but not limited to, the number of the machines to be tested 120 of a certain order or the quantity predetermined by the user. For example, after the server 130 receives the analysis results of all the machines to be tested 120 of the order, the pass rate of the RMT test of all the machines to be tested 120 of the order can be calculated and be provided to the manufacturer for reference in the display manner.

Through the design of the batch testing system 100 of the embodiment, the test result of each machine to be tested 120 can be continuously processed after the RMT test, which overcomes the problem that in the prior art, all the test results must be analyzed by a upper computer, resulting in inefficient testing. In addition, each test result exists in the local machine of each machine to be tested 120, and the analysis of each test result is processed by each machine to be tested 120 separately. Once the test result of a certain machine to be tested 120 is abnormal during the analysis process, it only affects the test result of the RMT test of the certain machine to be tested 120, and does not cause the problem that in the prior art, the test results of other machines to be tested on the production line may not be analyzed since all the test results need to be checked in the serial manner.

In this embodiment, each machine to be tested 120 may further comprise an indication module 40, which is connected to the transmission module 90, and may be configured to trigger an indication operation to indicate test completion after the transmission module 90 transmits the analysis result to the server 130, so that the operator in the production testing stage knows whether the machine to be tested 120 has completed the RMT test. The indicator module 40 can be, but is not limited to, a light-emitting diode (LED) module. When the LED module is displayed in green, the analysis result is for passing the RMT test; and when the LED module is displayed in red, the analysis result is for failing the RMT test, but the embodiment is not intended to limit the present invention, and can be adjusted according to actual needs.

Figure 2:
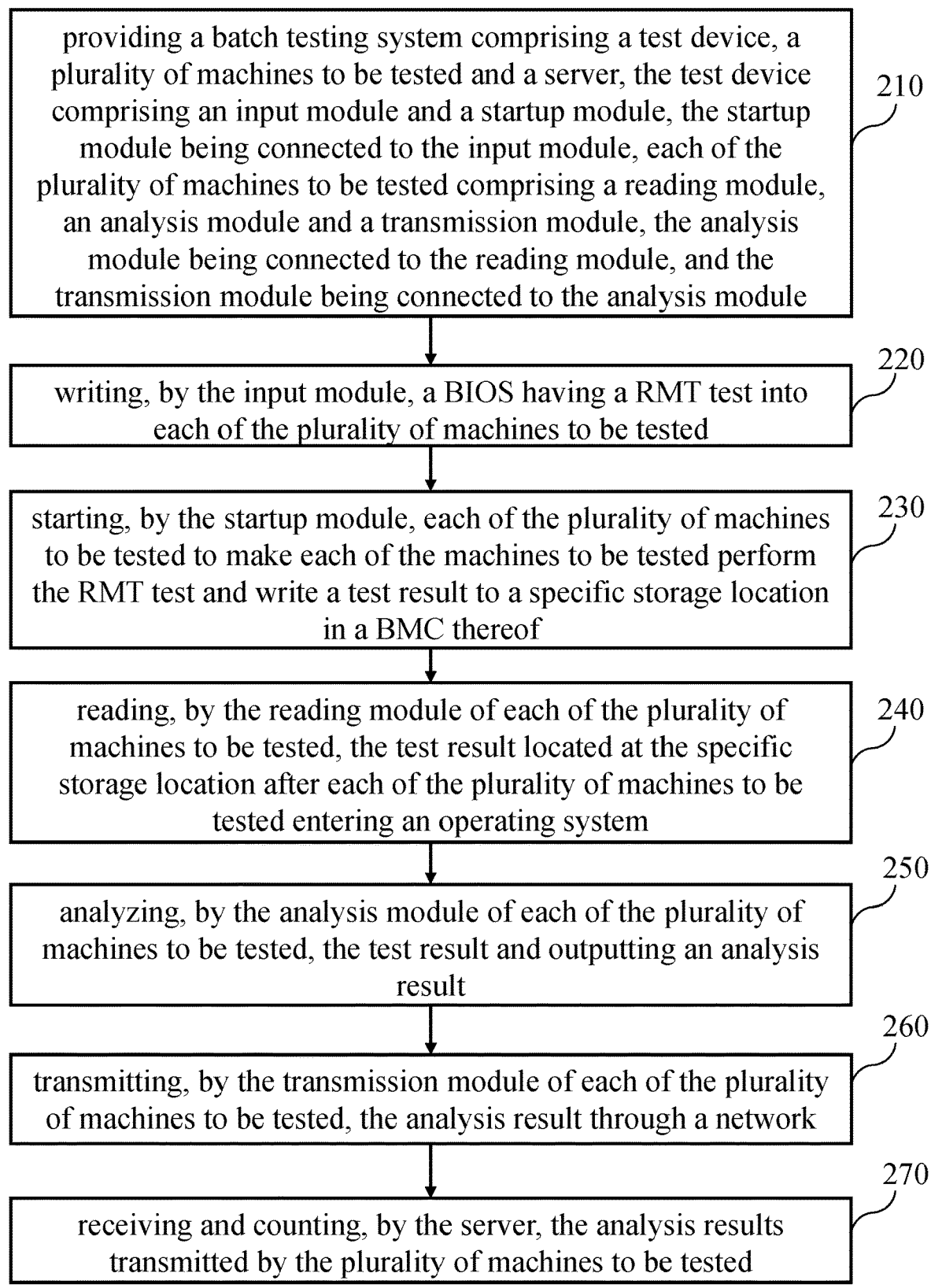
FIG. 2 is a flow chart of an embodiment of a batch testing method implemented by the batch testing system of FIG. 1.

Next, please refer to FIG. 2, and FIG. 2 is a flow chart of an embodiment of a batch testing method implemented by the batch testing system of FIG. 1. In this embodiment, the batch testing method comprises the following steps: providing a batch testing system comprising a test device, a plurality of machines to be tested and a server, the test device comprising an input module and a startup module, the startup module being connected to the input module, each of the plurality of machines to be tested comprising a reading module, an analysis module and a transmission module, the analysis module being connected to the reading module, and the transmission module being connected to the analysis module (step 210); writing, by the input module, a BIOS having a RMT test into each of the plurality of machines to be tested (step 220); starting, by the startup module, each of the plurality of machines to be tested to make each of the machines to be tested perform the RMT test and write a test result to a specific storage location in a BMC thereof (step 230); reading, by the reading module of each of the plurality of machines to be tested, the test result located at the specific storage location after each of the plurality of machines to be tested entering an operating system (step 240); analyzing, by the analysis module of each of the plurality of machines to be tested, the test result and outputting an analysis result (step 250); transmitting, by the transmission module of each of the plurality of machines to be tested, the analysis result through a network (step 260); and receiving and counting, by the server, the analysis results transmitted by the plurality of machines to be tested (step 270).

Through the above steps, the RMT test can be deployed in the production testing stage, the automatic test processing is achieved, thereby suitable for the production testing stage.

In this embodiment, each machine to be tested may further comprise an indication module connected to the transmission module and the analysis module. After the step of transmitting, by the transmission module of each of the plurality of machines to be tested, the analysis result through the network, the batch testing method further comprises: triggering, by the indication module of each of the plurality of machines to be tested, an indication operation to indicate test completion. The indicating module may be, but not limited to, an LED module. Therefore, the step of triggering, by the indication module of each of the plurality of machines to be tested, the indication operation to indicate test completion further comprises: when the LED module is displayed in green, the analysis result is for passing the RMT test; and when the LED module is displayed in red, the analysis result is for failing the RMT test.

In addition, in order to provide the manufacturer with a pass rate of the machines to be tested for its production in the RMT test, in the embodiment, the batch testing method may further comprise: displaying, by the server, a pass rate when the number of the analysis results received by the server reaching a predetermined value.

It is to be noted that the batch testing method of the present embodiment can perform the above steps in any order, except that the causal relationship is explained.

In summary, it can be seen that the difference between the present invention and the prior art is that the test device writing the BIOS with the RMT test to each machine to be tested, and starting each machine to be tested to run the RMT test, and then each machine to be tested writing the test result to the specific storage location in the BMC thereof; next, when entering the operating system, each machine to be tested reading and analyzing the test result at the specific storage location to output the analysis result, and then transmitting the analysis result to the server through the network; and after that, the server receiving and counting the analysis results transmitted by the machines to be tested. Above-mentioned technical means can be used to solve the problem, the present invention can deploy the RMT test in the production testing stage, the automatic test processing is achieved, and no intervention from operators is required in the whole process, thereby suitable for the production testing stage.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A batch testing system, suitable for a production testing stage, comprising:
    a test device comprising:
        an input module, configured to write a basic input/output system (BIOS) having a rank margining tool (RMT) test into each machine to be tested; and
        a startup module, connected to the input module, and configured to start each of the machines to be tested to make each of the machines to be tested perform the RMT test and write a test result to a specific storage location in a baseboard management controller (BMC) thereof;

the machines to be tested, each of the machines to be tested comprising:
 a reading module, configured to read the test result located at the specific storage location after entering an operating system;
 an analysis module, connected to the read module, and configured to analyze the test result and output an analysis result; and
 a transmission module, connected to the analysis module, and configured to transmit the analysis result through a network; and
a server, configured to receive and count the analysis results transmitted by the machines to be tested.

2. The batch testing system according to claim 1, wherein each of the machines to be tested further comprises an indication module connected to the transmission module and the analysis module, and the indication module is configured to trigger an indication operation to indicate test completion after the transmission module transmits the analysis result to the server.

3. The batch testing system according to claim 2, wherein the indication module is a light-emitting diode (LED) module; when the LED module is displayed in green, the analysis result is for passing the RMT test; and when the LED module is displayed in red, the analysis result is for failing the RMT test.

4. The batch testing system according to claim 1, wherein when the number of the analysis results received by the server reaches a predetermined value, a pass rate is displayed by the server.

5. A batch testing method, suitable for a production testing stage, comprising following steps:
 providing a batch testing system comprising a test device, a plurality of machines to be tested and a server, the test device comprising an input module and a startup module, the startup module being connected to the input module, each of the plurality of machines to be tested comprising a reading module, an analysis module and a transmission module, the analysis module being connected to the reading module, and the transmission module being connected to the analysis module;
 writing, by the input module, a BIOS having a RMT test into each of the plurality of machines to be tested;
 starting, by the startup module, each of the plurality of machines to be tested to make each of the machines to be tested perform the RMT test and write a test result to a specific storage location in a BMC thereof;
 reading, by the reading module of each of the plurality of machines to be tested, the test result located at the specific storage location after each of the plurality of machines to be tested entering an operating system;
 analyzing, by the analysis module of each of the plurality of machines to be tested, the test result and outputting an analysis result;
 transmitting, by the transmission module of each of the plurality of machines to be tested, the analysis result through a network; and
 receiving and counting, by the server, the analysis results transmitted by the plurality of machines to be tested.

6. The batch testing method according to claim 5, wherein each of the plurality of machines to be tested further comprises an indication module connected to the transmission module and the analysis module, and after the step of transmitting, by the transmission module of each of the plurality of machines to be tested, the analysis result through the network, the batch testing method further comprises: triggering, by the indication module of each of the plurality of machines to be tested, an indication operation to indicate test completion.

7. The batch testing method according to claim 6, wherein the indication module is an LED module, and the step of triggering, by the indication module of each of the plurality of machines to be tested, the indication operation to indicate test completion further comprises: when the LED module is displayed in green, the analysis result is for passing the RMT test; and when the LED module is displayed in red, the analysis result is for failing the RMT test.

8. The batch testing method according to claim 5, wherein the batch testing method further comprises: displaying, by the server, a pass rate when the number of the analysis results received by the server reaching a predetermined value.

* * * * *